(12) United States Patent
Fong et al.

(10) Patent No.: US 7,397,698 B2
(45) Date of Patent: *Jul. 8, 2008

(54) REDUCING FLOATING GATE TO FLOATING GATE COUPLING EFFECT

(75) Inventors: Yupin Fong, Fremont, CA (US); Daniel C. Guterman, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 11/735,265

(22) Filed: Apr. 13, 2007

(65) Prior Publication Data

US 2007/0195602 A1   Aug. 23, 2007

Related U.S. Application Data

(63) Continuation of application No. 11/021,872, filed on Dec. 23, 2004, now Pat. No. 7,230,851.

(51) Int. Cl.
G11C 16/04 (2006.01)

(52) U.S. Cl. ............... 365/185.17; 365/185.24; 365/185.29

(58) Field of Classification Search ........... 365/185.17, 365/185.24, 185.29
See application file for complete search history.

(56) References Cited

U.S. PATENT DOCUMENTS

| 5,132,935 | A | 7/1992 | Ashmore |
| 5,270,979 | A | 12/1993 | Harari |
| 5,295,107 | A | 3/1994 | Okazawa |
| 5,576,992 | A | 11/1996 | Mehrad |
| 5,680,350 | A | 10/1997 | Lee |
| 5,930,174 | A * | 7/1999 | Chen et al. ............. 365/185.29 |
| 6,031,766 | A | 2/2000 | Chen |
| 6,137,729 | A * | 10/2000 | Choi ..................... 365/185.29 |
| 6,172,909 | B1 | 1/2001 | Haddad |
| 6,252,803 | B1 | 6/2001 | Fastow |
| 6,288,938 | B1 | 9/2001 | Park |
| 6,438,037 | B1 | 8/2002 | Fastow |
| 6,522,580 | B2 | 2/2003 | Chen |
| 6,522,585 | B2 | 2/2003 | Pasternak |
| 6,587,903 | B2 | 7/2003 | Roohparvar |
| 6,590,811 | B1 | 7/2003 | Hamilton |
| 6,639,844 | B1 | 10/2003 | Liu |
| 6,654,287 | B2 | 11/2003 | Visconti |
| 6,657,891 | B1 | 12/2003 | Shibata |
| 6,661,711 | B2 | 12/2003 | Pan |
| 6,684,173 | B2 | 1/2004 | Kessenich |
| 6,711,056 | B2 | 3/2004 | Abedifard |
| 6,714,459 | B2 | 3/2004 | Hirano |
| 6,735,114 | B1 | 5/2004 | Hamilton |
| 6,735,116 | B2 | 5/2004 | Lee |
| 6,798,698 | B2 | 9/2004 | Tanaka |
| 7,072,216 | B2 * | 7/2006 | Kim ....................... 365/185.17 |
| 7,230,851 | B2 * | 6/2007 | Fong et al. ............. 365/185.17 |

* cited by examiner

*Primary Examiner*—David Lam
(74) *Attorney, Agent, or Firm*—Vierra Magen Marcus & DeNiro LLP

(57) ABSTRACT

For a non-volatile memory system, compressing the erase threshold voltage distribution into the lowest threshold voltage state will decrease the valid data threshold voltage window. Decreasing the valid data threshold voltage window reduces the floating gate to floating gate coupling effect. The compression can be performed as part of the erase process or part of the programming operation.

33 Claims, 10 Drawing Sheets

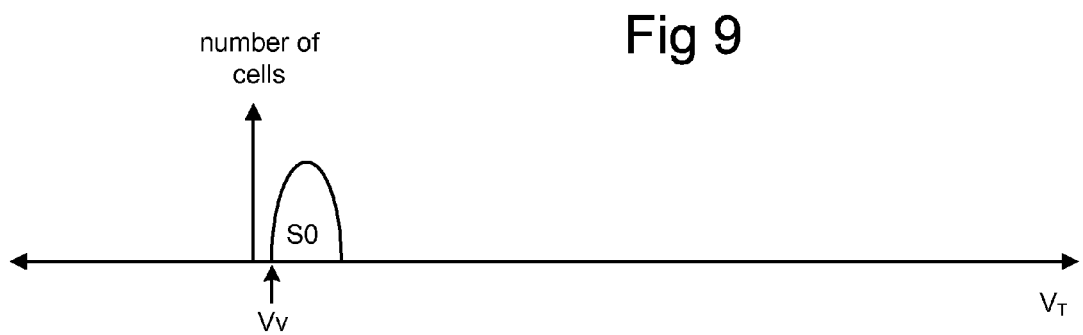
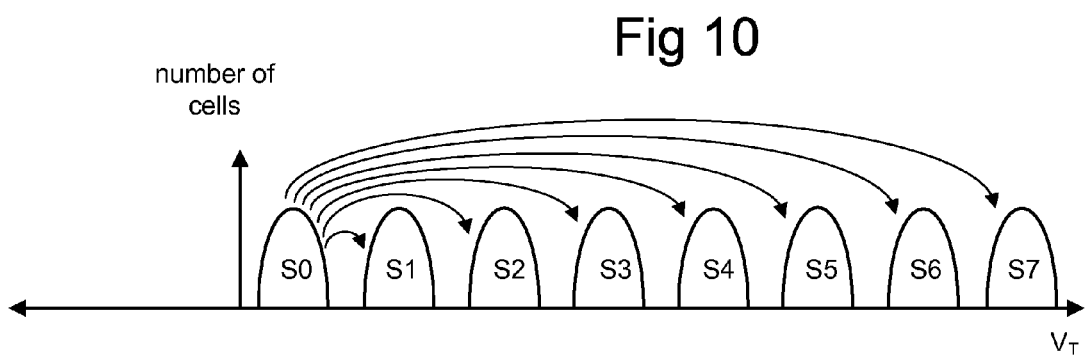

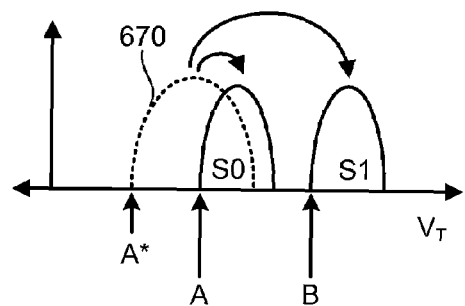
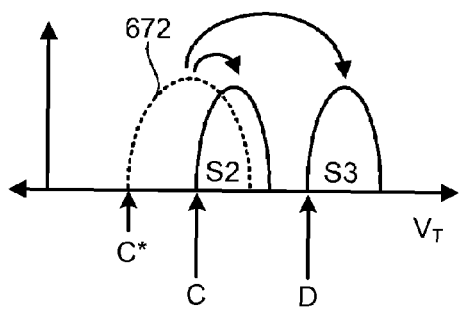
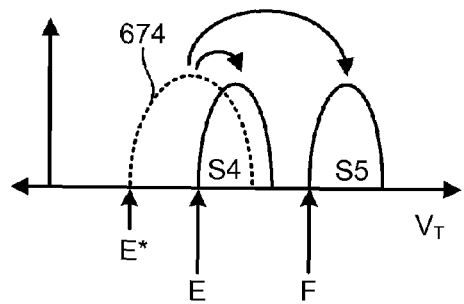
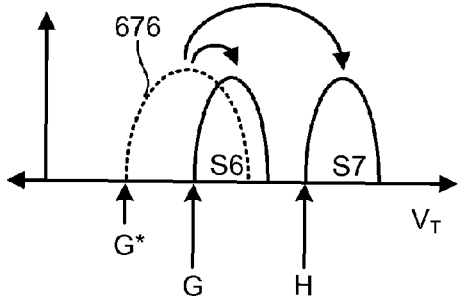
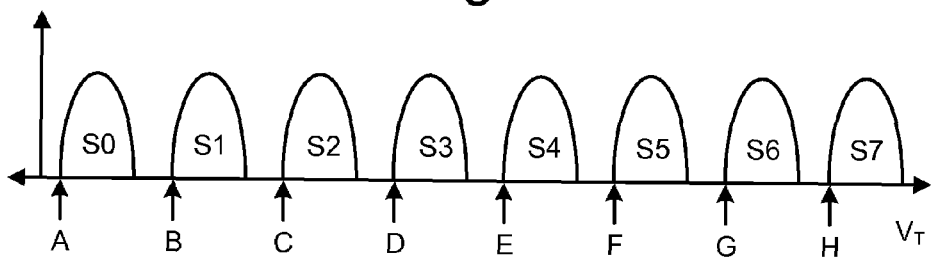

REDUCING FLOATING GATE TO FLOATING GATE COUPLING EFFECT

This application claims the benefit of and is a continuation of U.S. patent application Ser. No. 11/021,872, filed on Dec. 23, 2004, now U.S. Pat. No. 7,230,851, "Reducing Floating Gate To Floating Gate Coupling Effect," incorporated herein by reference in its entirety.

BACKGROUND OF THE INVENTION

1. Field of the Invention

The present invention relates to technology for non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. patent application Ser. No. 10/379,608, titled "Self Boosting Technique," filed on Mar. 5, 2003; U.S. patent application Ser. No. 10/629,068, titled "Detecting Over Programmed Memory," filed on Jul. 29, 2003; U.S. Pat. Nos. 6,522,580; and 6,643,188; all four of which are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored on a floating gate can occur because of the coupling of an electric field based on the charge stored in adjacent floating gates. This phenomena is described in U.S. Pat. No. 5,867,429, which is incorporated herein by reference in its entirety. The problem occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of the floating gate to floating gate coupling is of greater concern for multi-state devices because multi-state devices typically have smaller threshold voltage margins between states than that of binary devices, in addition to storing greater amounts of charge. Additionally, the difference in charge stored between the lowest state and the highest state of a multi-state device is likely to be greater than the difference in charge stored between the erased and programmed states of a binary memory device. The magnitude of the voltage coupled between adjacent floating gates is based on the magnitude of charge stored on the adjacent floating gates.

As memory cells continue to shrink in size, the associated reduction in space between word lines as well as between bit lines will also increase the coupling between adjacent floating gates. Furthermore, the natural programming and erase distributions of threshold voltages are expected to increase due to short channel effects, greater oxide thickness/coupling ratio variations and more channel dopant fluctuations. This will dictate increased the separation between the lowest state and the highest state of multi-state memory devices. Also, as more bits of data are encoded in a multi-state memory device, more states are needed; therefore, there will be a greater separation between the lowest state and the highest state. Increasing the separation between the lowest state and the highest state of multi-state memory devices may increase the coupled voltage between adjacent floating gates.

Thus, there is a need to reduce the effect of coupling between floating gates.

SUMMARY OF THE INVENTION

Compressing the erase threshold voltage distribution into the lowest (or another) valid data threshold voltage state will decrease the valid data threshold voltage window. Decreasing the valid data threshold voltage window reduces the magnitude of voltage coupled between floating gates.

For example, a set of non-volatile storage elements are erased by intentionally moving threshold voltages for the non-volatile storage elements to a range outside of valid data ranges, Subsequently, those threshold voltages of the non-volatile storage elements are compressed and moved to a valid data range.

In one embodiment, a set of non-volatile storage elements are erased by moving threshold voltages for the non-volatile storage elements to a first range. The first range is below zero volts. The threshold voltages are compressed and moved to a second range, where the second range is above zero volts. At least a subset of the non-volatile storage elements are programmed from the second range to one or more of additional ranges above zero volts.

Various embodiments of the present invention include operating one or more non-volatile storage elements. For example, the technology described herein can be used to erase an array of flash memory devices (or other types of non-volatile storage elements). One embodiment utilizes multi-state NAND flash memory. In some example implementations, the erasing and programming of the one or more non-volatile storage elements is performed by or at the direction of one or more control circuits in communication with an array of flash memory devices (or other types of non-volatile storage elements). The components of the control circuits may differ based on the particular implementation. For example, one or more control circuits may include any one of the following components or any combination of two or more of the following components: controller, command circuits, state machine, row control, column control, source control, p-well or n-well control, or other circuits that perform similar functionality.

BRIEF DESCRIPTION OF THE DRAWINGS

FIG. 8 is a graph depicting a threshold voltage distribution.
FIG. 9 is a graph depicting a threshold voltage distribution.
FIG. 10 is a graph depicting various threshold voltage distributions.
FIGS. 14-17, 18A-D, 19 are graphs depicting various threshold voltage distributions.

DETAILED DESCRIPTION

Figure 1:
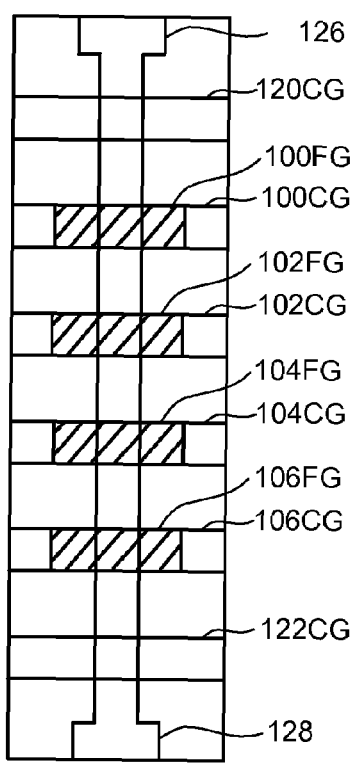
FIG. 1 is a top view of a NAND string.
Figure 2:
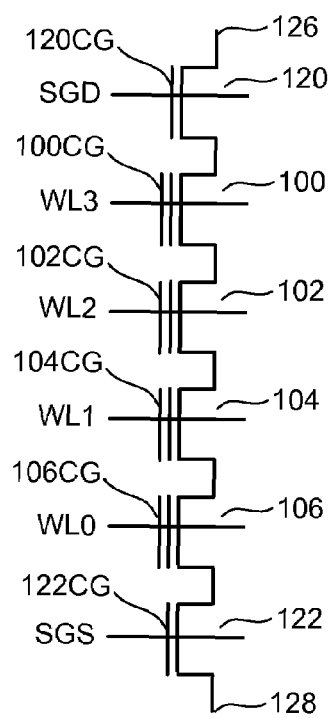
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
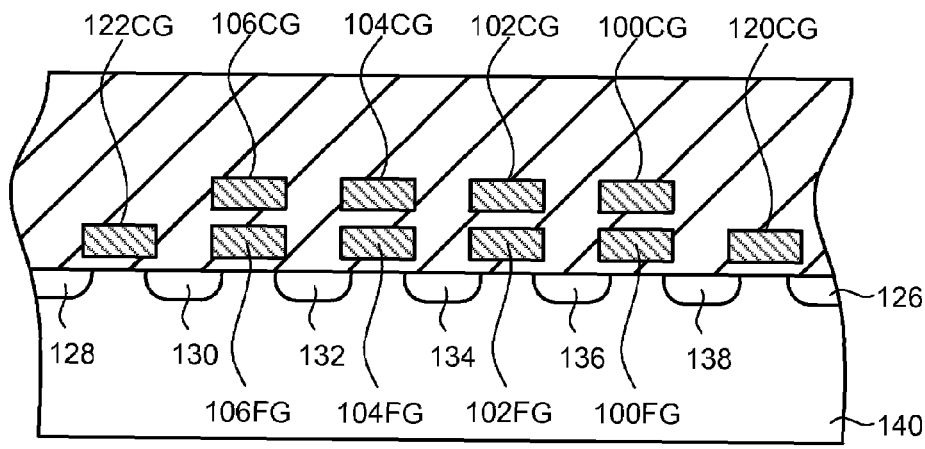
FIG. 3 is a cross sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG) corresponding to transistors 100, 102, 104, and 106 depicted in FIG. 2. The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104, 106 of FIG. 2) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 (as shown in FIG. 2 and connected to 122CG) and the source for transistor of 106, N+ doped layer 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped layer 138 serves as the drain for transistor 100 and the source for transistor 120 (as shown in FIG. 2 and connected to 120 CG). N+ doped layer 126 connects to the bit line for the NAND string, while N+ doped layer 128 connects to a common source line for multiple NAND strings.

Note that although FIGS. 1-3 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby, storing multiple bits of digital data. In the case of storing multiple states of data, the threshold voltage window is divided into the number of states. For example, if four states are used, there will be four threshold voltage ranges assigned to the data values "11", "10", "0", and "00." In one example of a NAND type memory, the threshold voltage after an erase operation is negative and defined as "11." Positive threshold voltages are used for the states of "10", "0", and "00." In some implementations, the data values (e.g. logical states) are assigned to the threshold ranges using a gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528 and U.S. patent application Ser. No. 09/893,277 (Publication No. US2003/0002348). Other types of non-volatile memory can also be used with the present invention.

Figure 4:
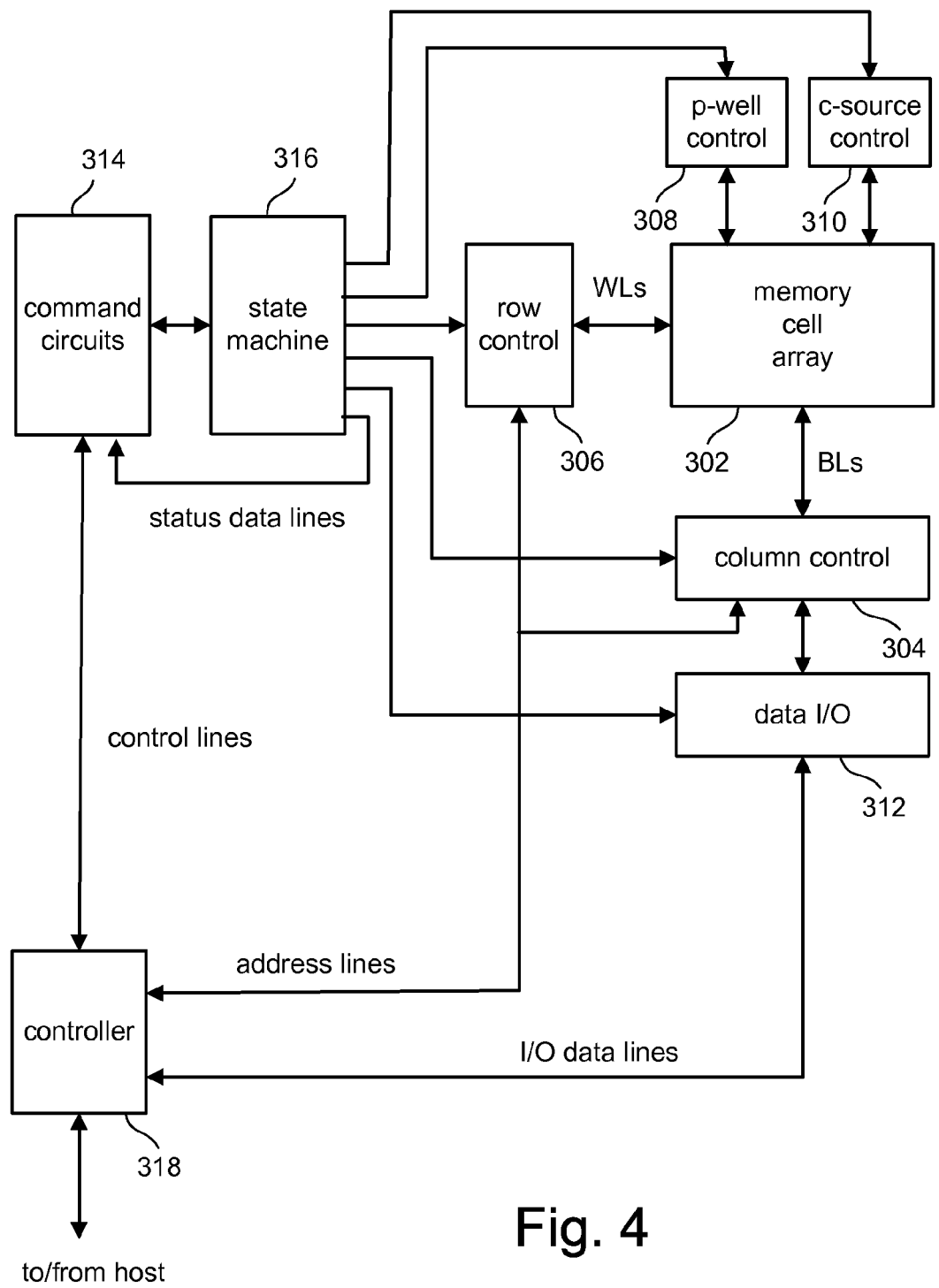
FIG. 4 is a block diagram of one embodiment of a non-volatile memory system in which the various aspects of the present invention are implemented.

FIG. 4 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 5) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller or control function being embedded in the host). Thus, the controller can be embedded in the host or included within a removable memory system.

In some implementations, some of the components of FIG. 4 can be combined. In various designs, one or more of the components of FIG. 4, other than memory cell array 302, can be thought of as one or more control circuits.

Figure 5:
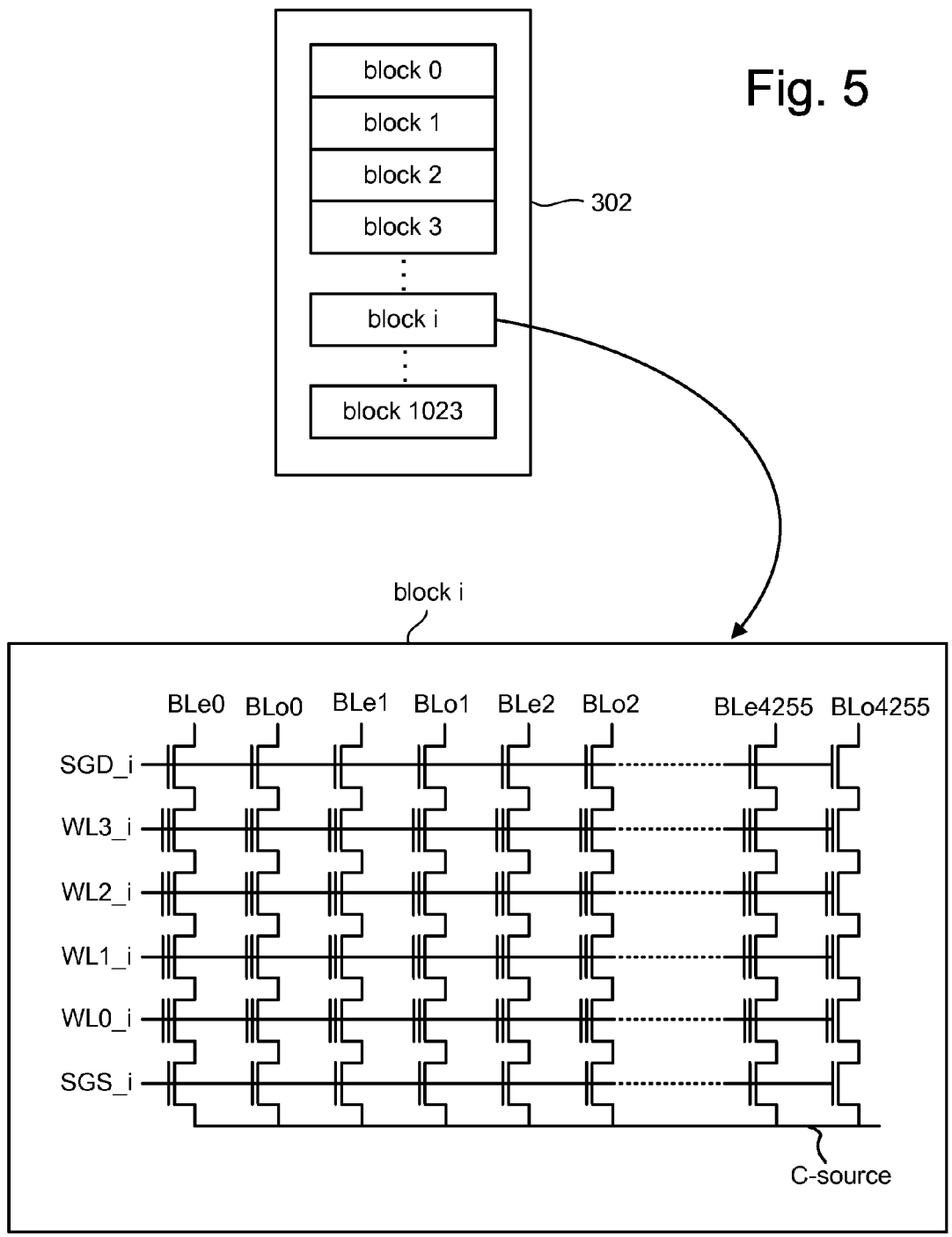
FIG. 5 illustrates an example of an organization of a memory array.

With reference to FIG. 5, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. Similarly, the bit lines are divided into even bit lines (BLe) and odd bit lines (BLo). FIG. 5 shows four memory cells connected in series to form a NAND string. Although four cells are shown to be included in each NAND string, more or less than four memory cells can be used. One terminal of the NAND string is connected to the corresponding bit line via a first select transistor SGD, and another terminal is connected to c-source via a second select transistor SGS.

During one embodiment of the read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 logical pages. When each memory cell stores three bits of data (e.g. a multi-level cell), one block stores 24 logical pages. Other sized blocks and pages can also be used with the present invention. Additionally, architectures other than that of FIGS. 4 and 5 can also be used to implement the present invention.

Memory cells are erased in one embodiment by raising the p-well to an erase voltage (e.g. 20 volts) for a sufficient period of time and grounding the word lines of a selected block to be erased while the source and bit lines are floating. Due to capacitive coupling, the unselected word lines, bit lines, select lines, and c-source of blocks not selected for erase are also raised to a high voltage (e.g., approximately 20V), thereby inhibiting their erase. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g. WL2) is connected to a reference voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0 v. In a verify operation for a two level memory cell, the selected word line WL2 is connected to 2.4 v, for example, so that as the programming progresses it is verified whether the threshold voltage has reached at least 2.4 v. The source and p-well are at zero volts during verify. In one embodiment, the selected bit lines (BLe) are pre-charged to a level of, for example, 0.7 v. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is thereby detected by a sense amplifier that is connected to the bit line.

When programming a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. Typically, the program voltage applied to the control gate is applied as a series of pulses. The magnitude of the pulses is increased with each successive pulse by a predetermined step size (e.g. 0.1 v, 0.2 v, 0.4 v, or other). In the periods between the pulses, verify operations are carried out. As the number of programmable states increase, the number of verify operations increases and more time is needed. One means for reducing the time burden of verifying is to use a more efficient verify process, such as the process that is disclosed in U.S. patent application Ser. No. 10/314,055, "Smart Verify for Multi-State Memories," filed Dec. 5, 2002, incorporated herein by reference in its entirety.

The erase, read, verify and program operations described above are performed according to techniques known in the art. Thus, many of the details explained can be varied by one skilled in the art. Other read and verify techniques known in the art can also be used.

Figure 6A:
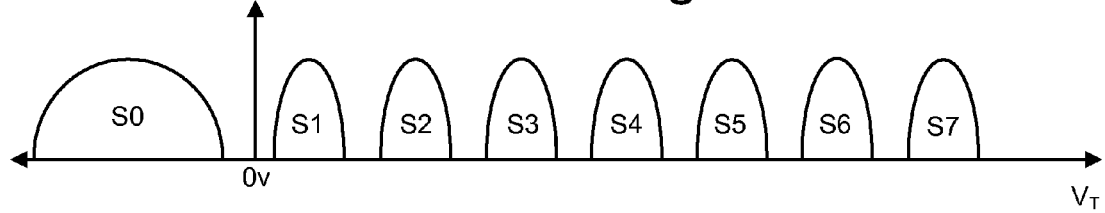
FIG. 6A is a graph depicting various threshold voltage distributions.

FIG. 6A is a graph depicting threshold distributions for a population of multi-state flash memory cells. In the example of FIG. 6A, each memory cell stores three bits of data; therefore, there are eight valid data states S0-S7. Data state S0 is depicted to be completely below 0 Volts. Data states S1-S7 are depicted to be above 0 Volts. Each data state corresponds to a unique value for the three bits stored in the memory cell. In some prior art devices, the memory cells will be erased to state S0. From state S0, the memory cells can be programmed to any of states S1-S7. As can be seen, the threshold voltage distribution S0 is wider than distributions S1-S7. Many prior art devices will perform a soft programming process to increase the threshold voltage of over erased memory cells.

As described above, the apparent threshold voltage Vt of a floating gate can be changed by coupling of an electric field from adjacent floating gates. The worst case floating gate to floating gate coupling will be perceived for a first memory cell that is adjacent to another memory cell that is programmed (or multiple memory cells that are programmed) from the lowest state S0 to the highest state S7 after the first memory cell is programmed. Thus, to reduce the floating gate to floating gate coupling, it may be desired to reduce the threshold voltage delta between the lowest state and the highest state. One means for reducing that floating gate to floating gate coupled voltage is to compress the lowest state into the lowest positive threshold voltage state. For example, state S0 will be compressed and moved to the location depicted in FIG. 6A for state S1. State S1 will be moved to the location depicted in FIG. 6A for state S2. State S2 will be moved to the location depicted in FIG. 6A for state S3, and so on.

Figure 6B:
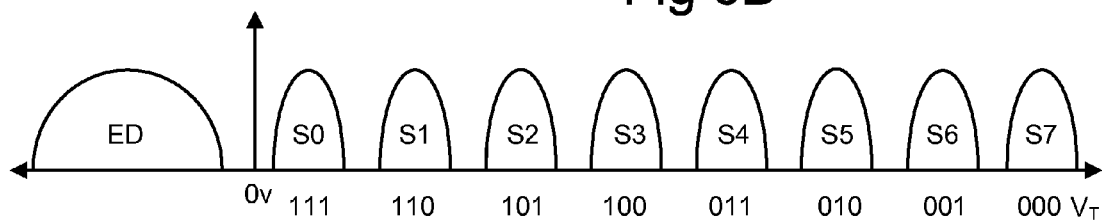
FIG. 6B is a graph depicting various threshold voltage distributions.

FIG. 6B illustrates one proposal for compressing and moving the erase threshold voltage distribution, as indicated above. FIG. 6B depicts eight states S0-S7 associated with valid data, all of which are above 0 Volts. State S0 is associated with valid data 111, S1 is associated with valid data 110, S2 is associated with valid data 101, S3 is associated with valid data 100, S4 is associated with valid data 011, S5 is associated with valid data 010, S6 is associated with valid data 001, and S7 is associated with valid data 000. Other schemes for encoding data with respect to various states can also be used.

FIG. 6B also shows the erased threshold voltage distribution ED. Erase threshold voltage distribution ED is not associated with valid data. Memory cells will first be erased to the erase threshold voltage distribution ED. That erase threshold voltage distribution ED will be compressed and moved to the lowest positive S0 state. In alternative embodiments, the states can be reversed. That is, the erased threshold voltage distribution could be the highest threshold voltages and the valid data states would be lower. In other embodiments, erased threshold voltage distribution ED can be compressed into a threshold voltage distribution that has some or all of the memory cells having a threshold voltage less than zero volts.

By compressing and moving the erased distribution, the total valid data threshold voltage window will be decreased, thereby reducing the floating gate to floating gate coupling effect. With reduction of the coupling effect, it may be possible to then decrease the widths of each specific threshold voltage distribution. The drawback, however, is that the time to do compression may slow down operation of the memory device. In one alternative, rather than decrease the width of the threshold voltage distributions, the step size of the program voltage applied to the control gate can be increased to speed up programming in order to compensate for the compression. In another embodiment, a combination of partially decreasing the width of the threshold voltage distributions and partially increasing the step size can be utilized.

The benefits of doing the compression and moving of the erased threshold voltage distribution can be explained with an example. Consider the original threshold voltage distributions S0-S7 depicted in FIG. 6A. An example of average threshold voltages for the eight states can be as follows: S0=−3.0V, S1=0.4V, S2=1.4V, S3=2.4V, S4=3.4V, S5=4.4V, S6=5.4V, and S7=6.4V. The total threshold voltage window for that example is at least 9.4V. The width of the threshold voltage distributions (e.g., for 1E9 cells) is determined by a number of factors, including the programming voltage equivalent step size, circuits/cell variations (noise, cell programming characteristics, sensing, etc.) and the magnitude of floating gate to floating gate coupling effect. The threshold voltage separation between the various data states is determined by sensing margin, disturb considerations, and data retention requirements. In the example depicted above with respect to FIG. 6A, the equivalent step size is approximately 0.1V. The circuit/cell variations for approximately 1E9 cells is 0.1V. The floating gate to floating gate coupling effect (for the worst case transition with a total threshold voltage window of 9.4V) is approximately 0.5V. The data retention requirement is approximately 0.3V between edges of states.

Thus, the separation between the middle of each state is approximately 1.0V (0.1+0.1+0.5+0.3).

If the erase distribution is compressed into the lowest positive threshold voltage state (e.g. ED compressed into S0), then the initial target for the average threshold voltages of the various states will be S0=0.4V, S1=1.4V, S2=2.4V, S3=3.4V, S4=4.4V, S5=5.4V, S6=6.4V and S7=7.4V. The total threshold voltage window is reduced from approximately 9.4V to approximately 7.0V, thereby reducing the floating gate to floating gate coupling effect from approximately 0.5V to approximately 0.37V. Feeding back into the separation requirements and recalculating the floating gate to floating gate coupling (0.3 v) results in the final target average threshold voltages being S0=0.4V, S1=1.2V, S2=2.0V, S3=2.8V, S4=3.6V, S5=4.4V, S6=5.2V, and S7=6.0V. With this separation, the threshold voltage window is reduced to approximately 5.6V. Thus, there is a 40% (0.2V) reduction in the floating gate to floating gate coupling effect.

The above example pertains to the three bit multi-state memory cell. The idea of compressing and moving the threshold voltage for the erase distribution can be applied to memory cells that store less than 3 bits or greater than 3 bits. For example, consider a memory cell that stores 2 bits of data. As an example, the average threshold voltage for the different states is approximately −2.0V for S0, 0.6 for S1, 1.9V for S2 and 3.2V for S3. The width of the threshold voltage distribution is due to 0.2V for the step size, 0.2V for the circuit/cell variations and 0.2V for the floating gate to floating gate coupling. Sense margins, disturb, and data retention requirements necessitate 0.7V between the edges of the various states. The total threshold voltage window is approximately 5.2V. If the erase distribution is compressed into lowest positive threshold voltage state, the initial target for the average threshold voltages for the different states would be S0=0.6V, S1=1.9V, S2=3.2V and S3=4.5V. The total threshold voltage window will be reduced from approximately 5.2V to approximately 3.9V, reducing the floating gate to floating gate effect from approximately 0.2V to approximately 0.15V. Feeding back into the separational requirements, the final target average threshold voltages will be S0=0.6V, S1=1.85V, S2=3.1V and S3=4.35V. This will lead to a 25% or 0.05V improvement in floating gate to floating gate coupling resulting from the total threshold voltage window reduction from approximately 5.2V to approximately 3.75V.

Figure 7:
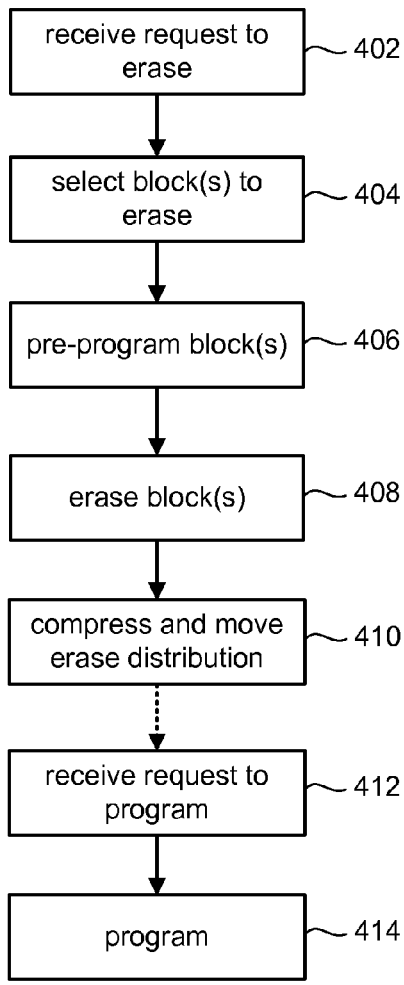
FIG. 7 is a flow chart describing one embodiment of a process for erasing and programming non-volatile memory.

FIG. 7 is a flow chart describing one embodiment of the process for erasing and programming, including performing the compression and moving of the erase threshold voltage distribution. The process of FIG. 7 is performed by the one or more control circuits described above. In step 402, the system will receive a request to erase data. In one embodiment, it is possible that there will not be a dedicated erase command. Rather, the system will erase (prior to programming) in response to a request to program. In step 404, the blocks to be erased are selected. At step 406, the blocks selected for erase will be pre-programmed. In one embodiment, before erasing, all memory cells in the block to be erased are programmed to the highest threshold voltage state. This is performed to ensure even wear and provide greater predictability in the erase process. Note that some embodiments do not include the pre-programming step. In step 408, the memory cells are erased. Various processes known in the art for erasing can be used. FIG. 8 shows threshold distribution ED. This depicts the state of the memory cells' threshold voltages after step 408 of FIG. 7.

In step 410, the erase threshold voltage distribution is compressed and moved to the lowest valid data state. In one embodiment, the erase threshold voltage distribution (which is negative) is compressed and moved to the lowest positive threshold voltage distribution. In embodiments where the erase threshold distribution is not negative, it can be moved to other valid data states or locations. In some embodiments, the erase threshold voltage distribution will be moved to the lowest valid data state.

FIG. 9, which shows threshold distribution S0, depicts the state of the threshold voltages after step 410. The erase threshold voltage distribution ED has been compressed and moved into state S0. By compressed it is meant that the width of the threshold voltage distribution is made narrower.

In step 412 of FIG. 7, the system will receive a request to program data. A dotted line is depicted to connect step 410 to step 412 because there could possibly be a long time lapse between the two steps. In step 414, the memory cells will be programmed from the state for which the erase distribution was compressed and moved into. For example, if the erase threshold voltage distribution ED is moved into the location for S0, then all the memory cells will be programmed from state S0 to the other states S1-S7. This is depicted in FIG. 10. Memory cells intended to store data 111, need not be programmed any further since they are already in state S0, which is associated with valid data 111. The memory cells can be programmed in step 414 according to many of various programming methods known in the art.

Figure 11:
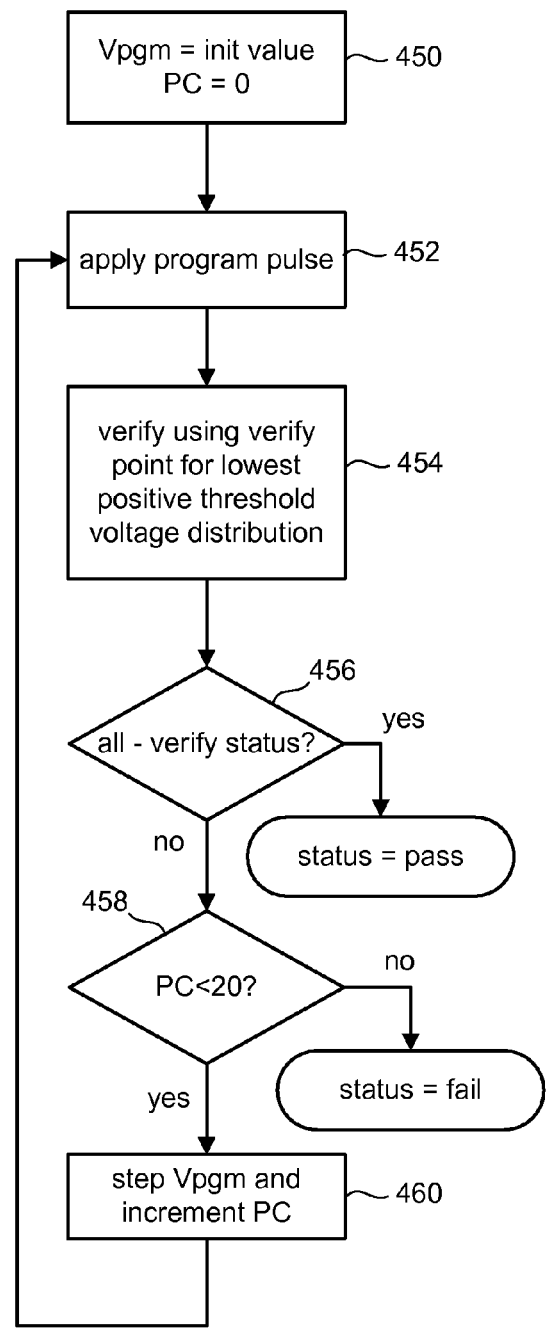
FIG. 11 is a flow chart describing one embodiment of a process for compressing and moving an erase distribution.

FIG. 11 is a flow chart describing one example of a process for compressing and moving an erase threshold voltage distribution (step 410 of FIG. 7). In one implementation, the process of compressing and moving the erase threshold voltage distribution is similar to the programming process. In step 450, the program voltage Vpgm that will be applied to the control gates of the memory cells is set to initial value. As indicated earlier, the program voltage is typically a series of pulses, with the pulses increasing in magnitude at each step. Also in step 450, a counter PC is reset to initial value of 0. In step 452, the first program pulse is applied to the control gates of the memory cells being compressed and moved. In one example, the magnitude of the initial program pulse is between 12-16 volts. In step 454, the memory cells are verified. In one embodiment, they are verified by determining whether the threshold voltage of the memory cell is at least as great as the lowest voltage in threshold voltage distribution S1. For example, each memory cell is tested using the verify voltage Vv (see FIG. 9). If the threshold voltage is greater than Vv, then the memory cell has been verified to have reached its target S0 verify value. If all of the memory cells are so verified (step 456) then the process of compressing and moving is finished and is completed successfully. If not all the memory cells have been verified, then in step 458 it is determined whether the program counter PC is less than 20 (or another suitable number). If so, then the program voltage is stepped to the next pulse magnitude and the program counter PC is incremented in step 460. After step 460, the process continues, looping back to step 452 and the next program voltage pulse is applied. If, at step 458, the program counter is not less than 20, then the process has failed. At the end of the process of FIG. 11, with a status of "pass," the erase threshold voltage distribution ED (see FIG. 8) will be compressed and moved into state S0 (see FIG. 9).

Figure 12:
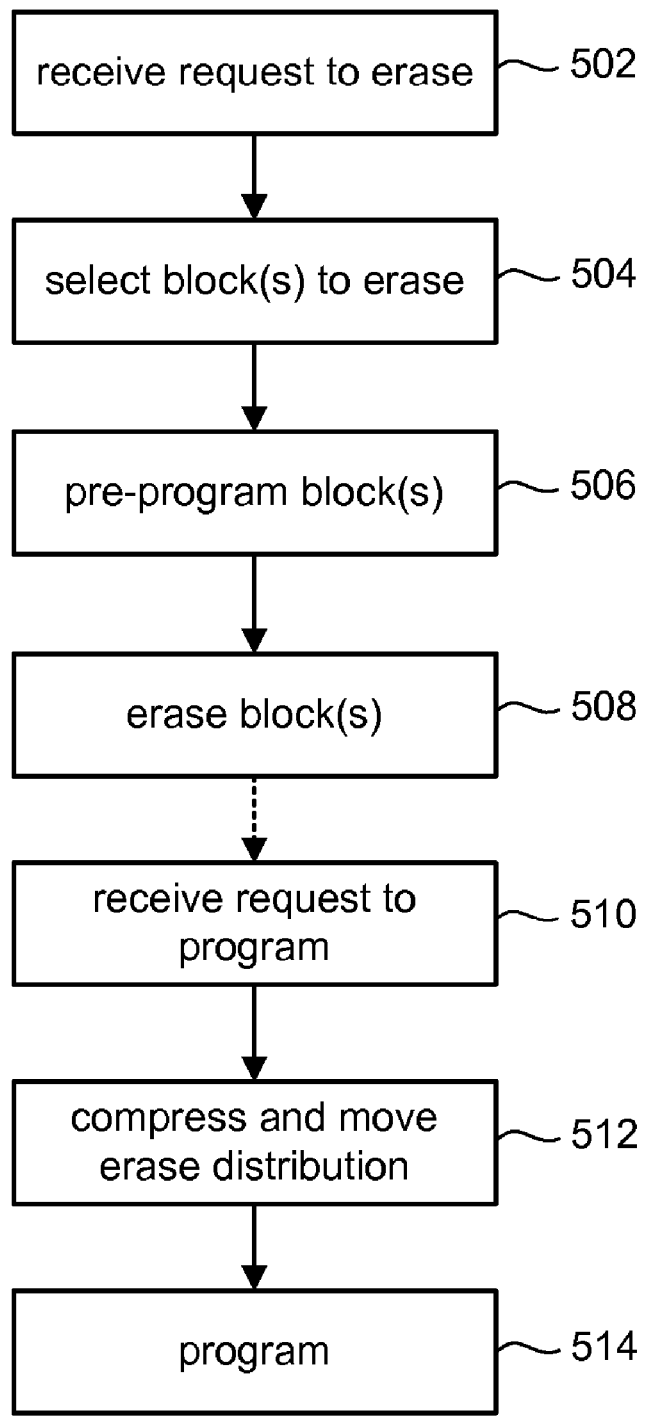
FIG. 12 is a flow chart describing one embodiment of a process for erasing and programming non-volatile memory.

FIG. 12 is a flowchart describing another embodiment for erasing and programming that includes the compression and movement of the erase threshold distribution. The process of FIG. 12 is very similar to the process of FIG. 7. For example, steps 502-508 are similar to steps 402-408. However, in the embodiment of FIG. 12, the compression and movement of the erase threshold voltage distribution is not done as part of the erase process. Rather, the compressing and moving is performed as part of the beginning of the programming process. After receiving the request to program in step 510, the system will compress and move the erase threshold voltage distribution, as described above, in step 512. In step 514, the memory cells are programmed.

U.S. Pat. No. 6,657,891, issued on Dec. 2, 2003, to Shibata et al. ("the '891 Patent"), incorporated herein by reference in its entirety, discloses another process for programming non-volatile memory that reduces floating gate to floating gate coupling. The process disclosed in the '891 Patent includes programming particular memory cells with respect to a particular page subsequent to writing to adjacent memory cells with respect to previous pages. The process described in the '891 Patent can be combined with the above compression and movement of the erase threshold voltage distribution to reduce the magnitude of floating gate to floating gate coupling effect.

Figure 13:
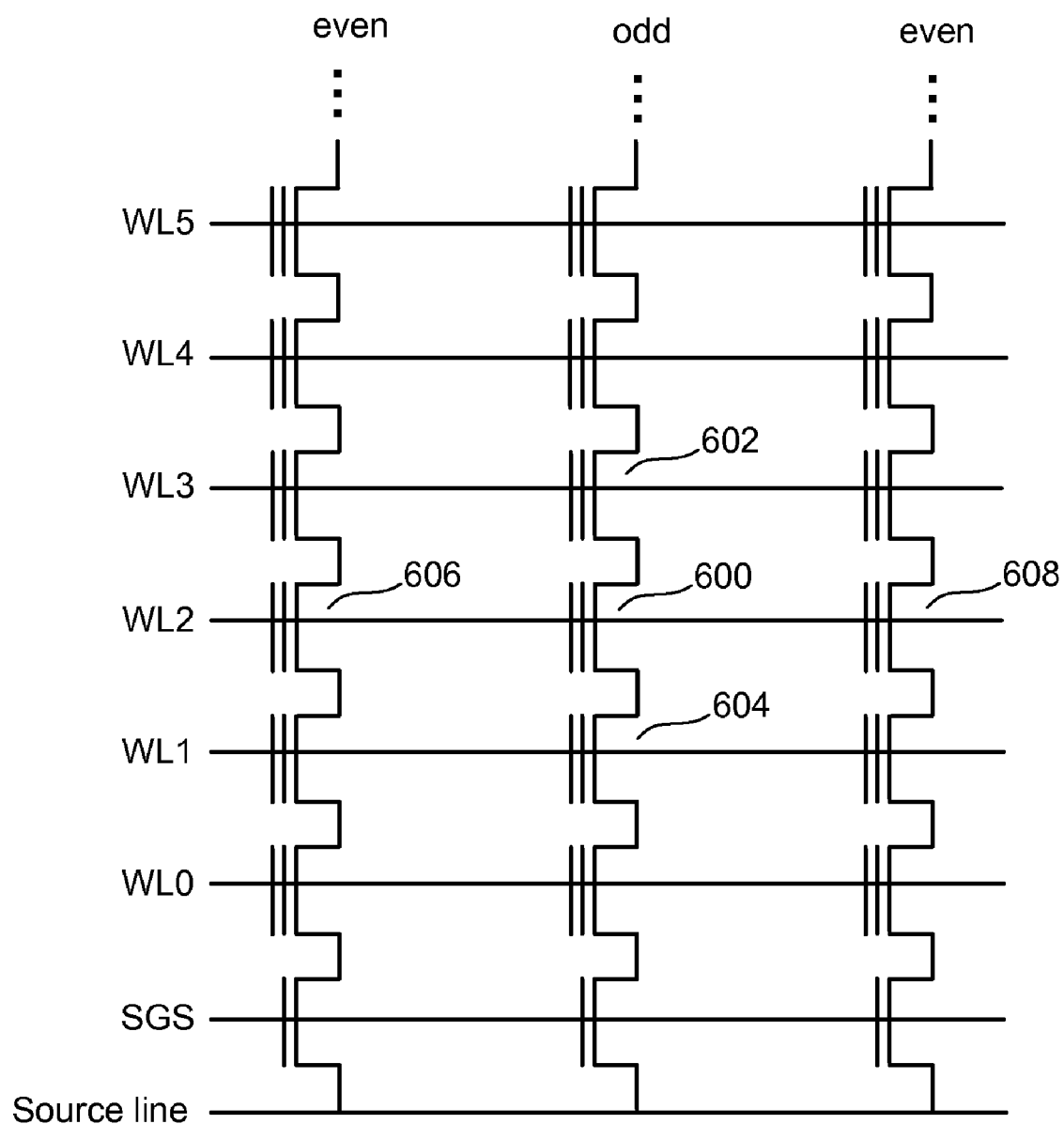
FIG. 13 is a circuit diagram depicting three NAND strings.
Figure 16:
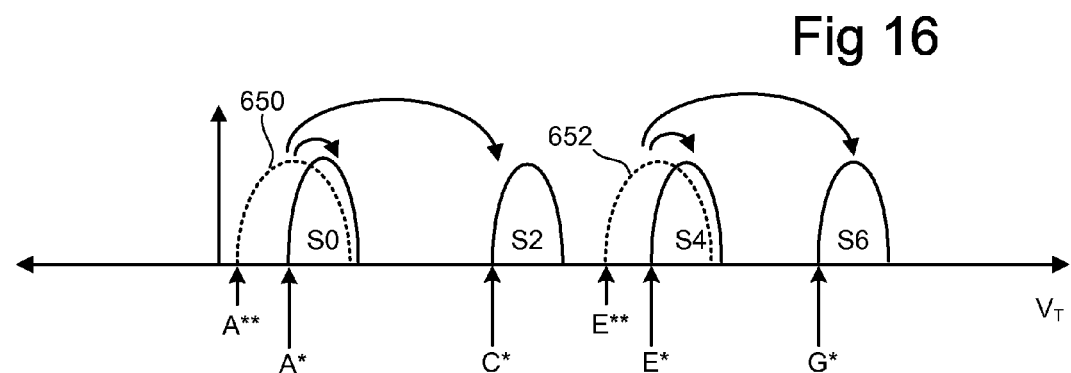

FIG. 13 shows a portion of three NAND strings within a block having multiple NAND strings. One NAND string depicted in FIG. 16 is an odd NAND string and the other two depicted NAND strings are even NAND strings. FIG. 13 only depicts five memory cells on the NAND strings; however, each of the NAND strings includes more than five memory cells.

A memory cell in a block can have up to four adjacent memory cells. Two of the adjacent memory cells can be on the same NAND string and two of the adjacent memory cells can be on neighboring NAND strings. For example, consider memory cell 600 which is on an odd NAND string and is connected to word line to WL2. Memory cell 600 has four adjacent memory cells: Two adjacent memory cells are on the same NAND string. For example, memory cell 600 is adjacent to memory cell 602 and memory cell 604. Memory cell 600 will also have an adjacent memory cell 606 on one of the adjacent even NAND strings and adjacent memory cell 608 on the other adjacent even NAND string. The process disclosed in the '891 Patent includes (from the point of view of memory cell 600) programming a first page for memory cell 600, then programming the first page for the memory cells adjacent to memory cell 600 and then programming the second page for memory cell 600, then programming the second page for the memory cells adjacent to memory cell 600 and then programming a third page for memory cell 600. Thus, for any particular memory cell, writing to that particular memory cell with respect to a particular page is performed subsequent to writing to adjacent memory cells for previous pages.

In one embodiment, the memory cells storing 3 bits of data store that data in three logical pages. These logical pages are programmed in the order described by the following table:

| Word line | Page | Even Column | Odd Column |
|---|---|---|---|
| WL5 | third | 40 | 41 |
| | second | 32 | 33 |
| | first | 24 | 25 |
| WL4 | third | 34 | 35 |
| | second | 26 | 27 |
| | first | 18 | 19 |
| WL3 | third | 28 | 29 |
| | second | 20 | 21 |
| | first | 12 | 13 |
| WL2 | third | 22 | 23 |
| | second | 14 | 15 |
| | first | 6 | 7 |
| WL1 | third | 16 | 17 |
| | second | 8 | 9 |
| | first | 2 | 3 |
| WL0 | third | 10 | 11 |
| | second | 4 | 5 |
| | first | 0 | 1 |

For example, the first page of the memory cells that are on the even columns and that are connected to word line WL0 are programmed first (operation 0). The first page of the memory cells that are on the odd columns and that are connected to word line WL0 are programmed second (operation 1). The first page of the memory cells that are on the even columns and that are connected to word line WL1 are programmed third (operation 2). The first page of the memory cells that are on the odd columns and that are connected to word line WL1 are programmed fourth (operation 3). At this point, the first page has been programmed for all of the memory cells adjacent to the memory cells that are on the even columns and that are connected to word line WL0; therefore, the second page can now be programmed for the memory cells that are on the even columns and that are connected to word line WL0 (operation 4). Subsequently, the second page of the memory cells that are on the odd columns and that are connected to word line WL0 are programmed (operation 5), and so on.

Prior to programming, the memory cells will be erased so that they are in the erase threshold distribution ED, as depicted in FIG. 8. Subsequently, the memory cells in the erase threshold voltage distribution ED will be compressed and moved to the state S0 as depicted in FIG. 9. These steps can be performed in accordance with the methods of FIG. 7 or FIG. 12. After the compression and movement, the programming of the pages of data will be performed in accordance with the above table so that for any particular memory cell, writing to that particular memory cell with respect to a particular page is performed subsequent to writing to adjacent memory cells for previous pages.

Figure 14:
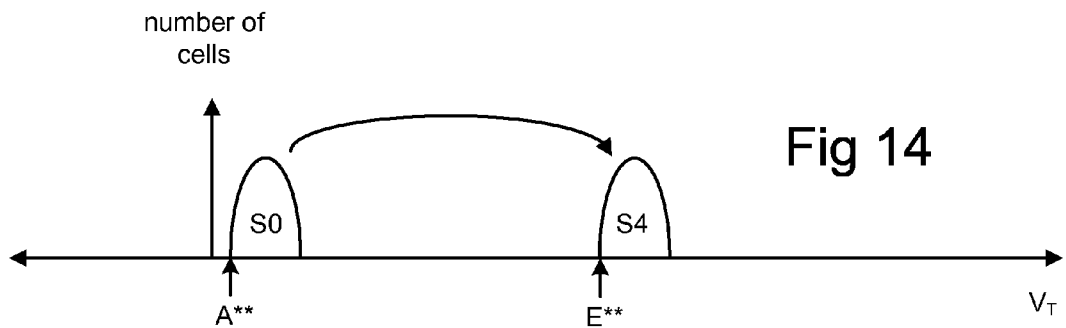

When programming each of the pages of data, the programming sequence between states is performed so that the transitions during the programming of the third page are minimized. As depicted in FIG. 6B, state S0 is associated with data 111. The first bit (the leftmost bit) is associated with the first page. The middle bit is associated with the second page. The rightmost bit is associated with the third page. In programming the first page (as described in FIG. 14), if the bit is to be data "1" then the memory cell will stay in state S0. If the bit is to be data "0" then the memory cell is programmed to state S4.

Figure 15:
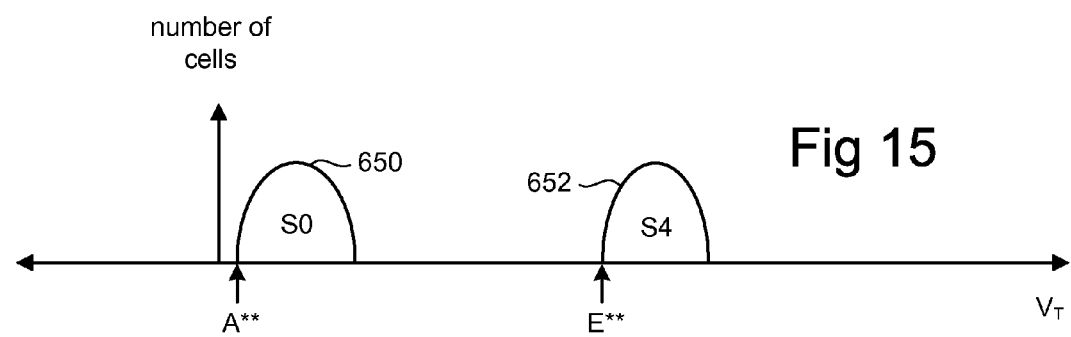

After adjacent memory cells are programmed, the floating gate to floating gate coupling effect will cause the states S0 and S4 to widen as depicted by threshold voltage distributions 650 and 652 of FIG. 15.

Figure 17:
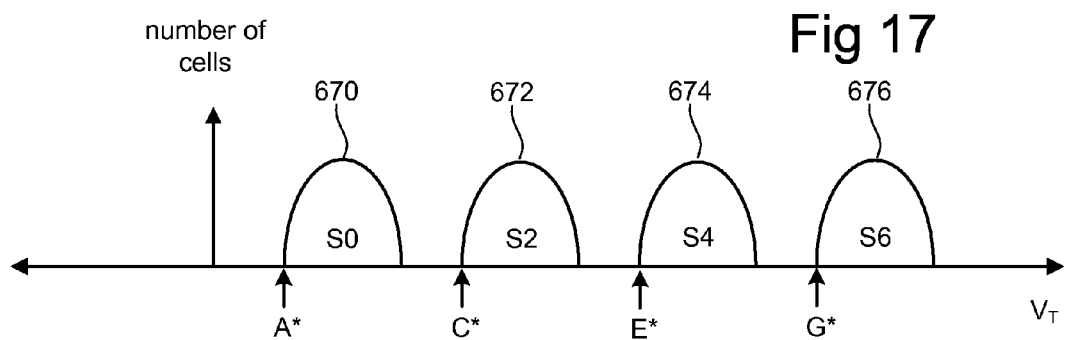

When programming the second page, if the memory cell is in state S0 and the second page bit is data "1" then the memory cell should stay in state S0. However, the programming process for the second stage will tighten threshold voltage 650 to the new S0. Thus, FIG. 16 shows threshold voltage distribution 650 being tightened to new state S0. The lowest voltage of state 650 (at A) is moved to beginning of new state S0** (at A*). If the memory cell was in state S0 and the data to be written to the second page is "0", then the memory cell is moved to state S2. State S2 has a verify point (lowest voltage)

of C*. If the memory cell was in state S4 and the data to be written to the memory cell is "1" then the memory cell remains in S4. However, state S4 is tightened by moving the distribution from distribution 652 to new state S4 depicted in FIG. 16, which has a verify point of E* (as compared to E** of threshold voltage distribution 652). If the memory cell is in state S4 and the data to be written to the second page is a "0" then the memory cell has its threshold voltage moved to state S6, with a verify point of G*. After the adjacent memory cells are programmed, the states S0, S2, S4 and S6 are widened due to the floating gate to floating gate coupling, as depicted by threshold voltages distributions 670, 672, 674 and 676 of FIG. 17.

FIGS. 18A, B, C and D depict the programming of the third page. While one graph can be used to show the programming, the process is depicted in four graphs for visibility reasons. After the second page has been programmed, the memory cells are either in states S0, S2, S4 or S6. FIG. 18A shows the memory cell that is in state S0 being programmed for the third page. FIG. 18B shows the memory cell that is state S2 being programmed for the third page. FIG. 18C shows the memory cell that is in state S4 being programmed to the third page. FIG. 18D shows the memory cell that is in state S6 being programmed for the third page.

If the memory cell is in state S0 and the third page data is "1" then the memory cell remains at state S0. However, the programming of the third page includes performing some programming to tighten up the distribution from distribution 670 to tightened state S0 with a verify point of A. If the data for the third page is "0" then the threshold voltage for the memory cell is raised to be in state S1, with a verify point of B.

If the memory cells in state S2 and the data to be written in the third page is "1", then the memory cell will remain in state S2. However, some programming will be performed to tighten the threshold distribution 672 to a new state S2 with a verify point of C. If the data to be written to the third page is "0", then the memory cell will be programmed to state S3, with a verify point of D volts.

If the memory cell is in state S4 and the data to be written to the third page is "1" then the memory cell will remain in state S4. However, some programming will be performed so that threshold voltage distribution 674 will be tightened to new state S4 with a verify point of E. If the memory cell is in state S4 and the data to be written to the third page is "0" then the memory cell will have its threshold voltage raised to be in state S5, with a verify point of F.

If the memory cells in state S6 and the data to be written to the third page is "1" then the memory cell will remain in state S6. However, there will be some programming so that the threshold voltage distribution 676 is tightened to be in new state S6, with a verify point at G. If the third page data is "0" then the memory cell will have its threshold voltage programmed to state S7, with a verify point at H. At the conclusion of the programming of the third page, the memory cell will be in one of the eight states depicted in FIG. 19.

To reduce floating gate to floating gate coupling effect, a system can combine the techniques described above. Thus, after compressing and moving the erase distribution, the memory cells are programmed so that the transitions between states for the different pages can be performed as depicted in FIGS. 14 through 19, and the order of programming among cells can be as depicted in the Table above. Such a combination will further reduce the floating gate to floating gate coupling effect. For example, if the programming process of FIGS. 14-19 and the table above is used with the eight states having the average threshold voltages of S0=−3.0V, S1=0.4V, S2=1.4V, S3=2.4V, S4=3.4V, S5=5.4V, S6=5.4V and S7=6.4V, and not compressing and moving the erase threshold voltage distribution as described in FIGS. 7 and 12, the worst case transition is reduced from approximately 9.4V to approximately 3.4V. This 3.4V transition is from S0 to S1. Therefore, the floating gate to floating gate coupling would be reduced from approximately 0.5V to approximately 0.18V. Feeding this new coupling value back into the separation requirements discussed above, a new set of average threshold voltages for the various states include S0=−3.0V, S1=0.4V, S2=1.08V, S3=1.76V, S4=2.4V, S5=3.12V, S6=3.8V, and S7=4.48V. Adding the compression and movement of the erase threshold voltage distribution reduces the worst case transition to 1.0V (e.g., S0=0.4 to S1=1.4, S2=2.4 to S3=3.4, etc.), which reduces floating gate to floating gate coupling to approximately 0.053V (0.5/9.4×1.0). Feeding back into the separation requirements and recalculating the floating gate to floating gate coupling effect will result in average threshold voltages for various states of S0=0.4V, S1=0.94V, S2=1.48V, S3=2.02V, S4=2.56V, S5=3.1V, S6=3.64V, and S7=4.18V. Additionally, the floating gate to floating gate coupling reduces to approximately 0.04V, which takes into account the approximately 0.8V worst case transition (e.g., from distribution 670 to S1) when programming the third page. This can also be used to allow a larger step size when programming the second page to reduce programming time. Thus, the floating gate to floating gate coupling is reduced from 0.5 Volts to approximately 0.04 Volts (factor greater than 10).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating non-volatile memory, comprising:
    erasing a set of non-volatile storage elements by intentionally moving threshold voltages for said non-volatile storage elements to a first range of threshold voltages, said first range is not a valid data range;
    compressing said threshold voltages and moving said threshold voltages from said first range to a second range of threshold voltages; and
    performing a multi-pass programming process that programs at least a subset of said non-volatile storage elements from said second range to one or more of additional ranges that are valid data ranges.

2. A method according to claim 1, wherein:
    said multi-pass programming process includes a first pass and a second pass;
    said first pass includes programming at least some of said non-volatile storage elements from said second range to a third range of threshold voltages; and
    said second pass includes programming a first subset of non-volatile storage elements from said second range of threshold voltages to a fourth range of threshold voltages, programming a second subset of non-volatile storage elements from said second range of threshold voltages to a fifth range of threshold voltages, programming a third subset of non-volatile storage elements from said third range of threshold voltages to a sixth range of threshold voltages, and programming a fourth subset of non-volatile storage elements from said third range of threshold voltages to a seventh range of threshold voltages.

3. A method according to claim 2, wherein:
said multi-pass programming process includes a third pass; and
said third pass includes:
programming a fifth subset of non-volatile storage elements from said fourth range of threshold voltages to an eighth range of threshold voltages,
programming a sixth subset of non-volatile storage elements from said fourth range of threshold voltages to a ninth range of threshold voltages,
programming a seventh subset of non-volatile storage elements from said fifth range of threshold voltages to a tenth range of threshold voltages,
programming a eighth subset of non-volatile storage elements from said fifth range of threshold voltages to a eleventh range of threshold voltages.
programming a ninth subset of non-volatile storage elements from said sixth range of threshold voltages to an twelfth range of threshold voltages,
programming a tenth subset of non-volatile storage elements from said sixth range of threshold voltages to a thirteenth range of threshold voltages,
programming a eleventh subset of non-volatile storage elements from said seventh range of threshold voltages to a fourteenth range of threshold voltages, and
programming a twelfth subset of non-volatile storage elements from said seventh range of threshold voltages to a fifteenth range of threshold voltages.

4. A method according to claim 3, wherein:
each of said non-volatile storage elements stores data in multiple pages; and
said multi-pass programming process includes writing to a particular non-volatile storage element with respect to a particular page subsequent to writing to adjacent non-volatile storage elements for previous pages.

5. A method according to claim 2, wherein:
said fourth range of threshold voltages is a tightened version of said second range of threshold voltages; and
said sixth range of threshold voltages is a tightened version of said third range of threshold voltages.

6. A method according to claim 2, wherein:
each of said non-volatile storage elements stores data in multiple pages; and
said multi-pass programming process includes writing to a particular non-volatile storage element with respect to a particular page subsequent to writing to an adjacent non-volatile storage elements for a previous page.

7. A method according to claim 1, wherein:
said multi-pass programming process includes a first pass and a second pass;
said first pass includes programming at least some of said non-volatile storage elements from said second range to a third range of threshold voltages; and
said second pass includes programming a first subset of non-volatile storage elements from said second range of threshold voltages to a fourth range of threshold voltages and programming another subset of non-volatile storage elements from said third range of threshold voltages to another range of threshold voltages.

8. A method according to claim 1, wherein:
each of said non-volatile storage elements stores data in multiple pages; and said multi-pass programming process includes writing to a particular non-volatile storage element with respect to a particular page subsequent to writing to an adjacent non-volatile storage elements for a previous page.

9. A method according to claim 1, wherein:
said first range of threshold voltages is below zero volts;
said additional ranges are above zero volts.

10. A method according to claim 1, wherein:
said erasing includes removing charge from floating gates for said non-volatile storage elements; and
said compressing and moving includes adding charge to floating gates for said non-volatile storage elements.

11. A method according to claim 1, wherein:
said non-volatile storage elements are multi-state NAND flash memory elements.

12. A method according to claim 1, wherein:
said non-volatile storage elements are multi-state flash memory elements.

13. A method according to claim 1, wherein said moving said threshold voltages from said first range to said second range of threshold voltages includes moving said threshold voltages from a first state of a plurality of non-overlapping states to a second state of the plurality of non-overlapping states.

14. A method for operating non-volatile storage, comprising:
erasing a plurality of non-volatile storage elements to an erased threshold voltage distribution, said erased threshold voltage distribution is not a valid data threshold voltage distribution; and
moving threshold voltages for said non-volatile storage elements from said erased threshold voltage distribution to a set of valid data threshold voltage distributions, said moving threshold voltages includes using a multi-pass programming process that programs at least a subset of said non-volatile storage elements from said erased threshold voltage distribution to said set of valid data threshold voltage distributions.

15. A method according to claim 14, wherein:
said moving threshold voltages includes performing a first pass and a second pass;
said first pass includes programming at least some of said non-volatile storage elements from a first threshold voltage distribution to a second threshold voltage distribution; and
said second pass includes programming a first subset of non-volatile storage elements from said first threshold voltage distribution to a third threshold voltage distribution, programming a second subset of non-volatile storage elements from said first threshold voltage distribution to a fourth threshold voltage distribution, programming a third subset of non-volatile storage elements from said second threshold voltage distribution to a fifth threshold voltage distribution, and programming a fourth subset of non-volatile storage elements from said second threshold voltage distribution to a sixth threshold voltage distribution.

16. A method according to claim 15, wherein:
each of said non-volatile storage elements stores data in multiple pages; and
said multi-pass programming process includes writing to a particular non-volatile storage element with respect to a particular page subsequent to writing to an adjacent non-volatile storage element for a previous page.

17. A method according to claim 14, wherein:
said non-volatile storage elements are multi-state flash memory elements.

18. A method according to claim 14, wherein:
said erased threshold voltage distribution is below zero volts; and
said valid data threshold voltage distributions are above zero volts.

19. A non-volatile memory system, comprising:
a plurality of non-volatile storage elements;
means for erasing said non-volatile storage elements by intentionally moving threshold voltages for said non-volatile storage elements to a first range of threshold voltages, said first range is not a valid data range;
means for compressing said threshold voltages and moving said threshold voltages from said first range to a second range of threshold voltages; and
means for performing a multi-pass programming process that programs at least a subset of said non-volatile storage elements from said second range to one or more of additional ranges that are valid data ranges.

20. A non-volatile memory system according to claim 19, wherein said means for compressing said threshold voltages and moving said threshold voltages includes means for moving said threshold voltages from a first state of a plurality of non-overlapping states to a second state of the plurality of non-overlapping states.

21. A non-volatile memory system, comprising:
a plurality of non-volatile storage elements; and
one or more control circuits in communication with said non-volatile storage elements, said one or more control circuits erase said non-volatile storage elements by intentionally moving threshold voltages for said non-volatile storage elements to a first range of threshold voltages that is not associated with valid data, said one or more control circuits compress said threshold voltages and move said threshold voltages from said first range to a second range of threshold voltages, said one or more control circuits perform a multi-pass programming process that programs at least a subset of said non-volatile storage elements from said second range to one or more of additional ranges that are valid data ranges.

22. The non-volatile memory system according to claim 21, wherein:
said multi-pass programming process includes said one or more control circuits performing a first pass and a second pass;
said first pass includes said one or more control circuits programming at least some of said non-volatile storage elements from said second range to a third range of threshold voltages; and
said second pass includes said one or more control circuits programming a first subset of non-volatile storage elements from said second range of threshold voltages to a fourth range of threshold voltages, programming a second subset of non-volatile storage elements from said second range of threshold voltages to a fifth range of threshold voltages, programming a third subset of non-volatile storage elements from said third range of threshold voltages to a sixth range of threshold voltages, and programming a fourth subset of non-volatile storage elements from said third range of threshold voltages to a seventh range of threshold voltages.

23. The non-volatile memory system according to claim 21, wherein:
each of said non-volatile storage elements stores data in multiple pages; and
said multi-pass programming process includes said one or more control circuits writing to a particular non-volatile storage element with respect to a particular page subsequent to writing to an adjacent non-volatile storage element for a previous page.

24. The non-volatile memory system according to claim 21, wherein:
said first range of threshold voltages is below zero volts;
said additional ranges are above zero volts.

25. The non-volatile memory system according to claim 21, wherein:
said non-volatile storage elements are multi-state NAND flash memory elements.

26. The non-volatile memory system according to claim 21, wherein:
said non-volatile storage elements are multi-state flash memory elements.

27. A non-volatile memory system according to claim 21, wherein said first range of threshold voltages is a first state of a plurality of non-overlapping states and said second range of threshold voltages is a second state of the plurality of non-overlapping states.

28. A non-volatile memory system, comprising:
a plurality of non-volatile storage elements; and
one or more control circuits in communication with said non-volatile storage elements, said one or more control circuits erase said non-volatile storage elements to an erased threshold voltage distribution that is not associated with valid data, said one or more control circuits move threshold voltages for said non-volatile storage elements from said erased threshold voltage distribution to a set of valid data threshold voltage distributions, said moving threshold voltages includes said one or more control circuits using a multi-pass programming process that programs said non-volatile storage elements from said erased threshold voltage distribution to said set of valid data threshold voltage distributions.

29. A non-volatile memory system according to claim 28, wherein:
said one or more control circuits move threshold voltages by performing a first pass and a second pass;
said first pass includes said one or more control circuits programming at least some of said non-volatile storage elements from a first threshold voltage distribution to a second threshold voltage distribution; and
said second pass includes said one or more control circuits programming a first subset of non-volatile storage elements from said first threshold voltage distribution to a third threshold voltage distribution, programming a second subset of non-volatile storage elements from said first threshold voltage distribution to a fourth threshold voltage distribution, programming a third subset of non-volatile storage elements from said second threshold voltage distribution to a fifth threshold voltage distribution, and programming a fourth subset of non-volatile storage elements from said second threshold voltage distribution to a sixth threshold voltage distribution.

30. A non-volatile memory system according to claim 28, wherein:
each of said non-volatile storage elements stores data in multiple pages; and
said multi-pass programming process includes said one or more control circuits writing to a particular non-volatile storage element with respect to a particular page subsequent to writing to an adjacent non-volatile storage element for a previous page.

31. A non-volatile memory system according to claim 28, wherein:

said non-volatile storage elements are multi-state flash memory elements.

32. A non-volatile memory system according to claim 28, wherein:

said erased threshold voltage distribution is below zero volts; and said valid data threshold voltage distributions are above zero volts.

33. A non-volatile memory system according to claim 28, wherein the set includes at least two valid data threshold voltage distributions.

* * * * *